United States Patent
Lin

(10) Patent No.: US 11,610,892 B2
(45) Date of Patent: Mar. 21, 2023

(54) BURIED WORD LINE STRUCTURE AND MANUFACTURING METHOD THEREOF

(71) Applicant: Winbond Electronics Corp., Taichung (TW)

(72) Inventor: Chang-Hung Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/389,296

(22) Filed: Jul. 29, 2021

(65) Prior Publication Data

US 2022/0216211 A1 Jul. 7, 2022

(30) Foreign Application Priority Data

Jan. 6, 2021 (TW) .................................. 110100475

(51) Int. Cl.
*H01L 29/423* (2006.01)
*H01L 27/108* (2006.01)

(52) U.S. Cl.
CPC .................. *H01L 27/10823* (2013.01); *H01L 27/10876* (2013.01); *H01L 27/10891* (2013.01); *H01L 29/4236* (2013.01)

(58) Field of Classification Search
None
See application file for complete search history.

(56) References Cited

U.S. PATENT DOCUMENTS 9,634,011 B2 4/2017 Kang et al.
2021/0126090 A1* 4/2021 Kim .................. H01L 29/42368

FOREIGN PATENT DOCUMENTS

TW I539567 6/2016

* cited by examiner

*Primary Examiner* — Hsien Ming Lee
(74) *Attorney, Agent, or Firm* — JCIPRNET

(57) ABSTRACT

A buried word line structure, including a first isolation structure, a buried word line, a first barrier layer, a second barrier layer, a channel layer, and a second isolation structure, is provided. The first isolation structure is disposed in the substrate and has a trench. The buried word line is disposed on a bottom surface of the trench. The first barrier layer is disposed between the buried word line and a sidewall and the bottom surface of the trench. The second barrier layer covers a top surface of the buried word line and includes a main portion and an extension portion. The main portion is located on the buried word line, and the extension portion extends upward from periphery of the main portion. The channel layer is disposed on the first barrier layer and the second barrier layer. The second isolation structure is disposed on the channel layer.

10 Claims, 7 Drawing Sheets

10

BURIED WORD LINE STRUCTURE AND MANUFACTURING METHOD THEREOF

CROSS-REFERENCE TO RELATED APPLICATION

This application claims the priority benefit of Taiwan application serial no. 110100475, filed on Jan. 6, 2021. The entirety of the above-mentioned patent application is hereby incorporated by reference herein and made a part of this specification.

BACKGROUND

Technical Field

This disclosure relates to a semiconductor structure and a manufacturing method thereof, and in particular to a buried word line structure and a manufacturing method thereof.

Description of Related Art

Buried word line dynamic random access memory (DRAM) has been developed in recent years to enhance integration of DRAM, so as to speed up the operation of elements and to meet the demand of consumers for miniaturized electronic devices.

In general, the buried word line may be disposed in the isolation structure. However, when a distance between the buried word line and a capacitor disposed on the substrate is too close, electrons stored in the capacitor are easily attracted by the electric field generated by the buried word line, and resulting in generation of a leakage current.

SUMMARY

This disclosure provides a buried word line structure, in which a channel layer is disposed on a buried word line, and the channel layer is connected to a barrier layer disposed around the buried word line.

The disclosure provides a manufacturing method of a buried word line structure, which is used to manufacture the above-mentioned buried word line structure.

The buried word line structure of the disclosure includes a first isolation structure, a buried word line, a first barrier layer, a second barrier layer, a channel layer, and a second isolation structure. The first isolation structure is disposed in the substrate and has a trench. The buried word line is disposed on a bottom surface of the trench. The first barrier layer is disposed between the buried word line and a sidewall and the bottom surface of the trench. The second barrier layer covers a top surface of the buried word line and includes a main portion and an extension portion. The main portion is located on the buried word line, and the extension portion extends upward from periphery of the main portion. The channel layer is disposed on the first barrier layer and the second barrier layer. The second isolation structure is disposed on the channel layer.

The manufacturing method of the buried word line structure of the disclosure includes the following steps. Firstly, a first isolation structure is formed in the substrate. Next, a trench is formed in the first isolation structure. Then, a first barrier layer is formed on a lower portion sidewall and a bottom surface of the trench. Subsequently, a buried word line is formed on the first barrier layer. Then, a second barrier layer is formed on a top surface of the buried word line. The second barrier layer includes a main portion and an extension portion. The main portion is located on the buried word line, and the extension portion extends upward from periphery of the main portion. Then, a channel layer is formed on the first barrier layer and the second barrier layer. Subsequently, a second isolation structure is formed on the channel layer.

Based on the above, in the buried word line structure of the disclosure, the barrier layer with the extension portion is formed on the buried word line, and the channel layer is formed on the barrier layer with the extension portion. The channel layer extends downward next to the extension portion to connect to another barrier layer formed around the buried word line. In this way, the electric field in the corner region adjacent to the buried word line can be effectively reduced during operation of the device, so as to prevent the electrons stored in the capacitor from being attracted by the electric field generated by the buried word line and resulting in generation of the leakage current.

DESCRIPTION OF THE EMBODIMENTS

FIGS. 1A to 1G are schematic cross-sectional views of a manufacturing process of a buried word line structure according to an embodiment of the disclosure.

Figure 1A:
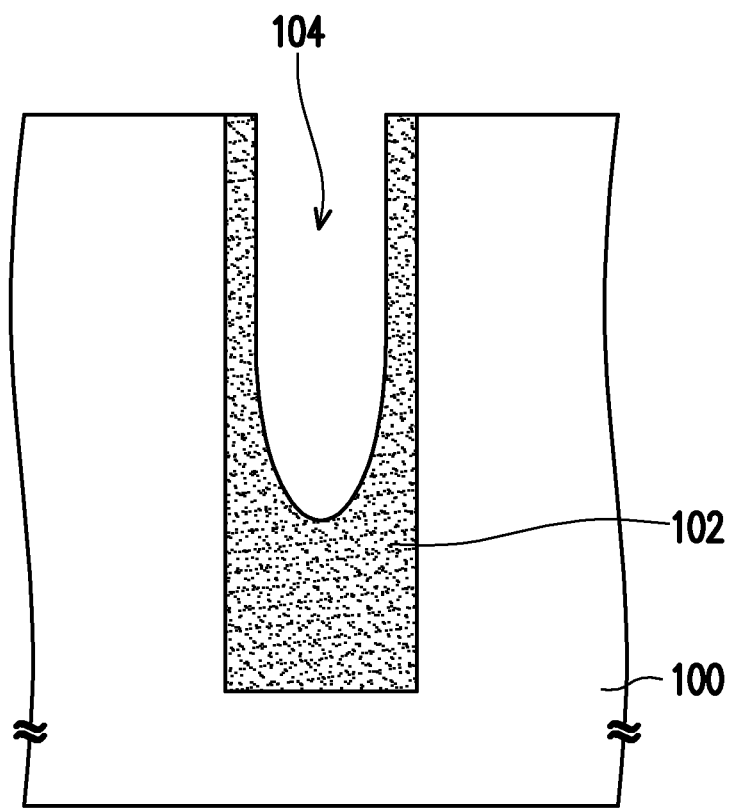
FIGS. 1A to 1G are schematic cross-sectional views of a manufacturing process of a buried word line structure according to an embodiment of the disclosure.

With reference to FIG. 1A, a substrate 100 is provided. The substrate 100 may be a semiconductor substrate. The substrate 100 is, for example, a silicon substrate. Next, a first isolation structure 102 is formed in the substrate 100. The first isolation structure 102 is a shallow trench isolation structure (STI), a material of the first isolation structure 102 is silicon nitride, but the disclosure is not limited thereto. In other embodiments, the material of the first isolation structure 102 may also be silicon oxide. Subsequently, a trench 104 is formed in the first isolation structure 102. The trench 104 is configured to define a region of a buried word line, which is formed subsequently.

Figure 1B:
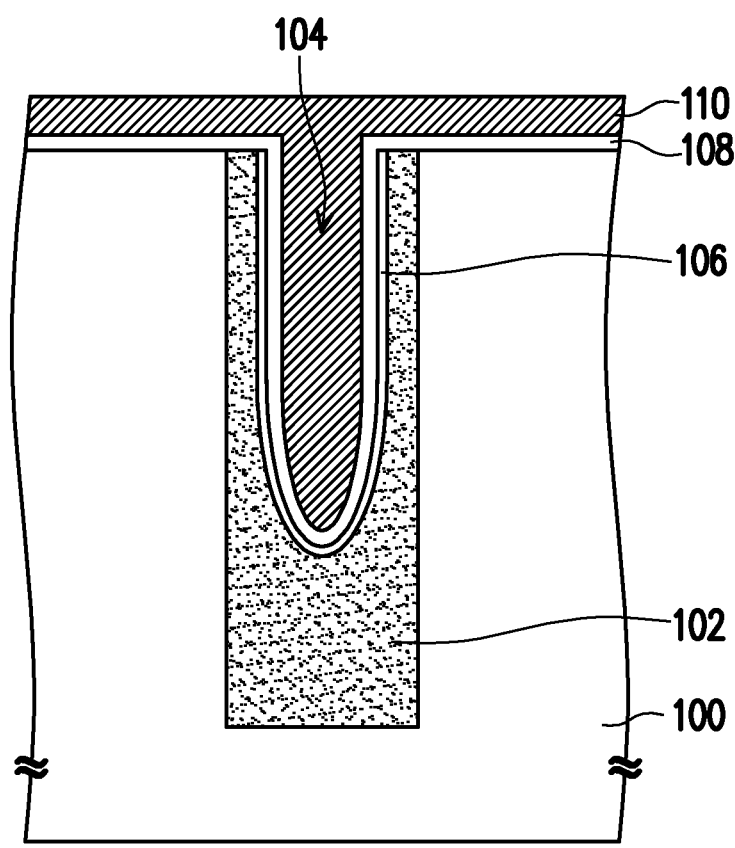

With reference to FIG. 1B, an insulation layer 106 may be formed on a sidewall and a bottom surface of the trench 104 after the trench 104 is formed. The insulation layer 106 is configured to reduce interference between multiple buried word lines formed subsequently. The insulation layer 106 is an in situ steam generation (ISSG) oxide layer, but the disclosure is not limited thereto. Next, a barrier material layer 108 is formed on the insulation layer 106 and a surface of the substrate 100. The barrier material layer 108 is a titanium nitride layer, but the disclosure is not limited thereto. Then, a word line material layer 110 is formed on the substrate 100 to fill up the trench 104. The word line material layer 110 is a tungsten layer, but the disclosure is not limited thereto.

Figure 1C:
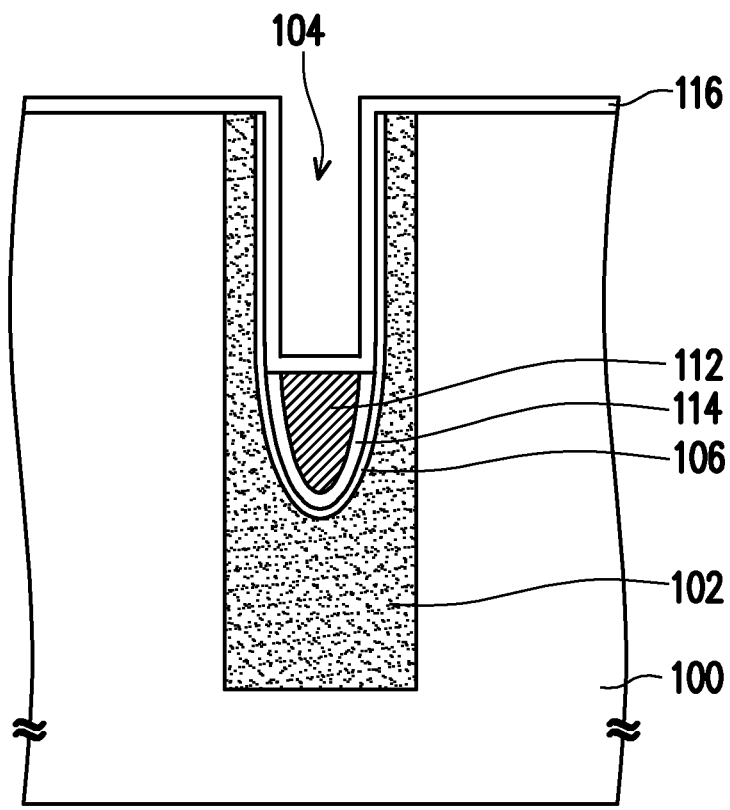

With reference to FIG. 1C, an etch-back process is performed to remove a portion of the barrier material layer 108 and a portion of the word line material layer 110, so as to form a buried word line 112 and a first barrier layer 114 that is located between the buried word line 112 and the sidewall and the bottom surface of the trench 104. The barrier material layer 108 and the word line material layer 110 on the surface of the substrate 100 and on a sidewall of an upper portion of the trench 104 are removed during the etch-back process. Next, a dielectric layer 116 is formed on the surface of the substrate 100, on the sidewall of the trench 104, on the buried word line 112, and on the first barrier layer 114. The dielectric layer 116 and the first isolation structure 102 are required to have an etch selectivity ratio. Since the material of the first isolation structure 102 is silicon nitride, a material of the dielectric layer 116 is silicon oxide. In other embodiments, the material of the dielectric layer 116 is, for example, silicon nitride, when the material of the first isolation structure 102 is, for example, silicon oxide. In addition, in order to prevent a subsequently formed channel layer from coming into contact with the buried word line 112, a thickness of the dielectric layer 116 must not exceed a thickness of the first barrier layer 114, which is described in detail later.

Figure 1D:
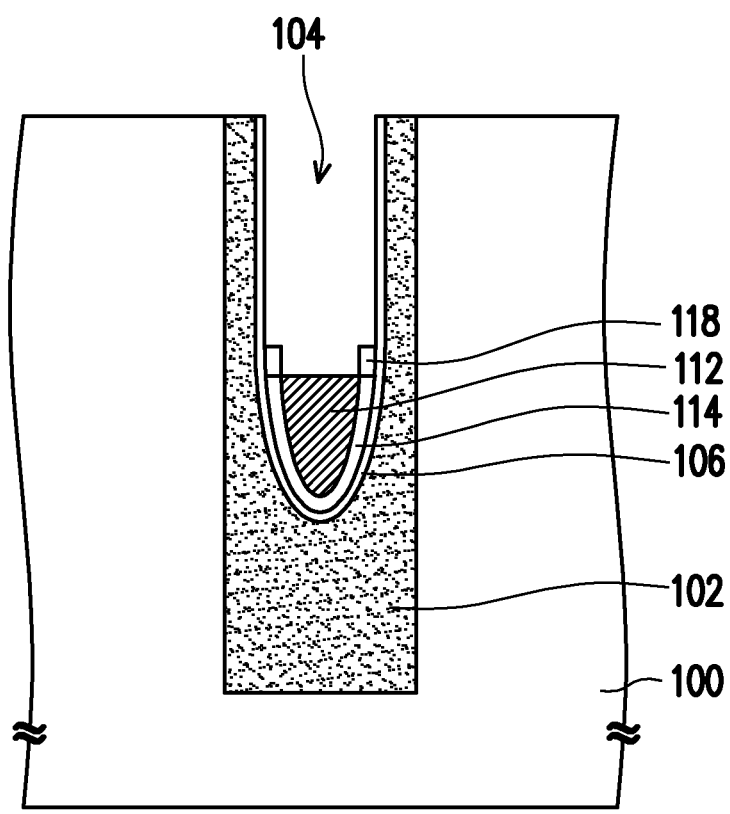

With reference to FIG. 1D, an etch-back process is performed to remove a portion of the dielectric layer 116, so as to form a dielectric structure 118. The dielectric layer 116 on the surface of the substrate 100, the sidewall of the upper portion of the trench 104, and the buried word line 112 are removed during the etch-back process, so as to expose a top surface of the buried word line 112 while retaining the dielectric layer 116 on a sidewall of a lower portion of the trench 104. The retained dielectric layer 116 forms a dielectric structure 118 on the first barrier layer 114. Since the thickness of the dielectric layer 116 does not exceed the thickness of the first barrier layer 114, the dielectric structure 118 formed is only located on the first barrier layer 114 and does not come into contact with the buried word line 112. In addition, due to the etch selectivity ratio between the dielectric layer 116 and the first isolation structure 102, the first isolation structure 102 is not damaged during the above-mentioned etch-back process.

Figure 1E:
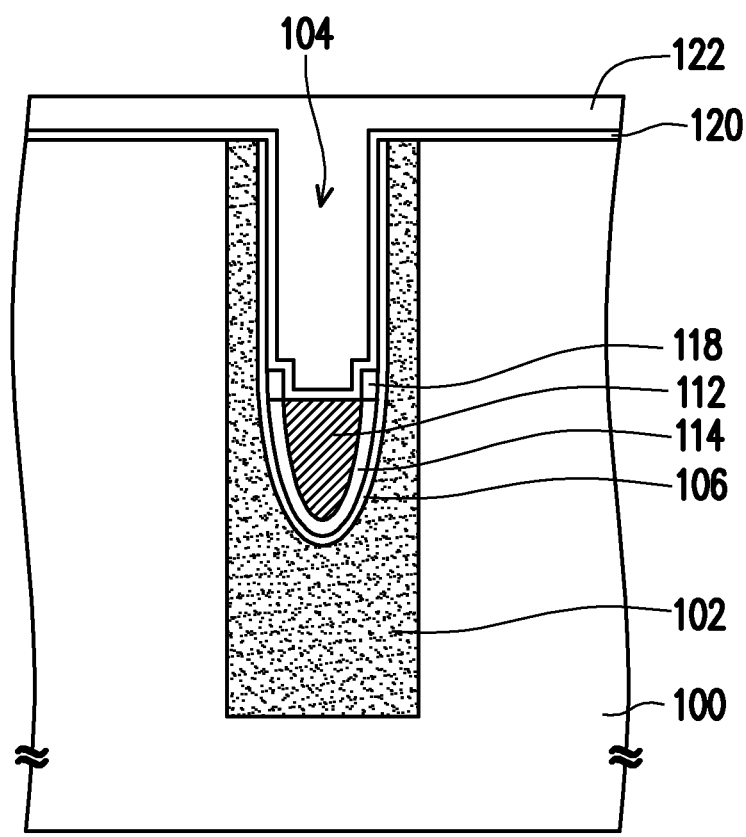

With reference to FIG. 1E, a barrier material layer 120 is formed on the surface of the substrate 100, on the sidewall of the trench 104, on the top surface of the buried word line 112, and on the dielectric structure 118. The barrier material layer 120 is a titanium nitride layer, but the disclosure is not limited thereto. Then, a protective material layer 122 is formed on the substrate 100 to fill up the trench 104, the protective material layer 122 is, a spin-on coating (SOC) layer, but the disclosure is not limited thereto.

Figure 1F:
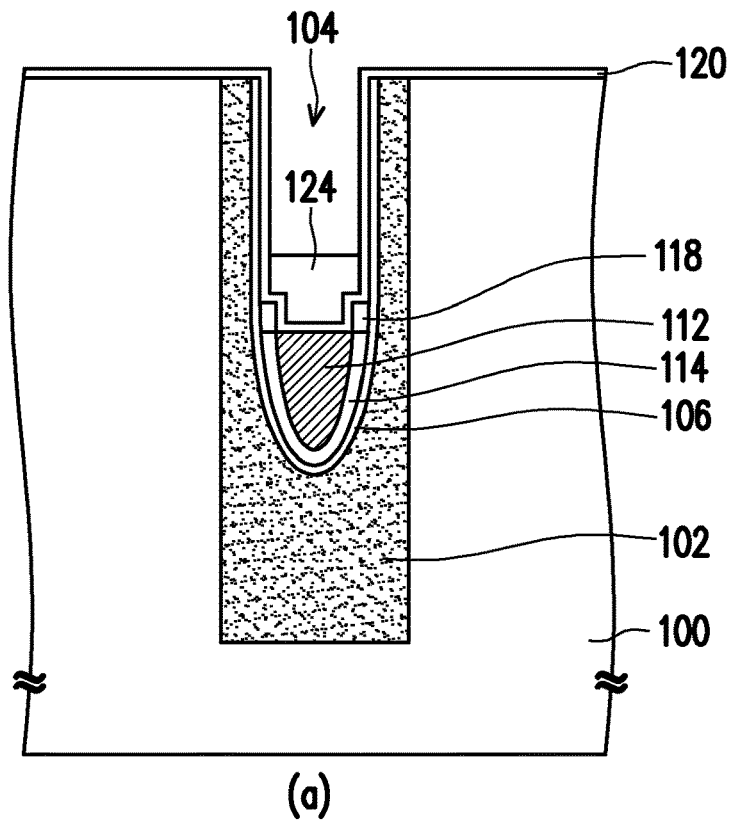
Figure 1F:
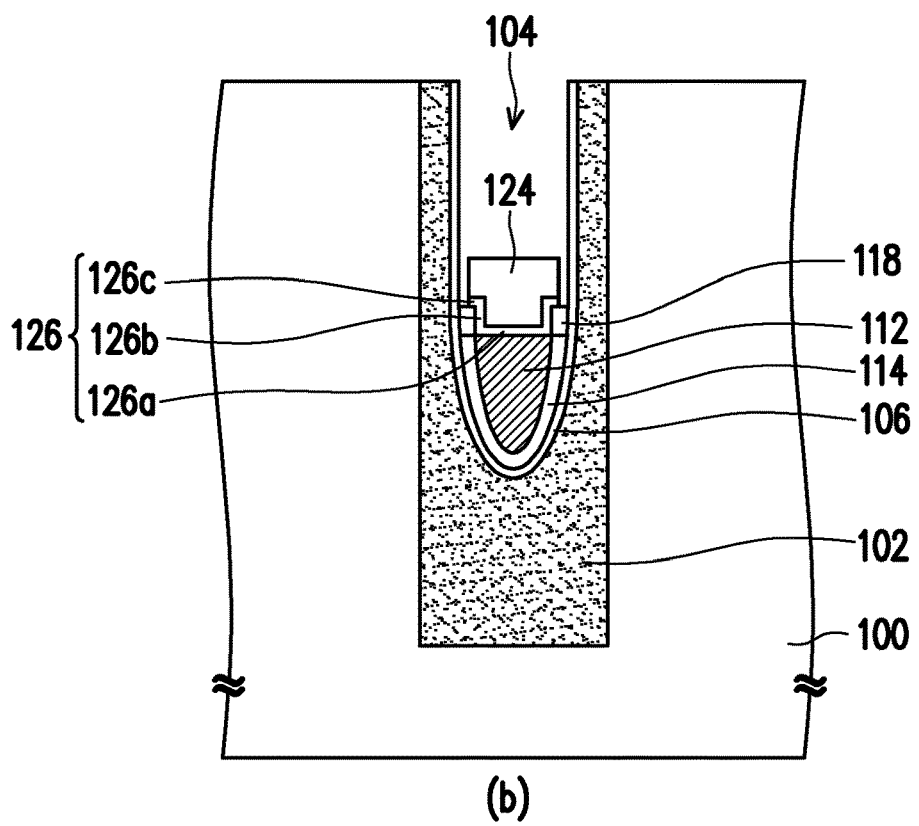

With reference to (a) of FIG. 1F, an etch-back process is performed on the protective material layer 122 to remove a portion of the protective material layer 122, so as to form a protective layer 124 on the barrier material layer 120. The protective layer 124 exposes the barrier material layer 120 on the upper portion of the trench 104. In other words, the protective layer 124 covers the top surface of the buried word line 112 and the barrier material layer 120 on a sidewall and a portion of a top surface of the dielectric structure 118. Then, with reference to (a) of FIG. 1F, an anisotropic etching process is performed to remove the barrier material layer 120 that is not covered by the protective layer 124, by using the protective layer 124 as an etching mask. In this way, a second barrier layer 126 is formed on the top surface of the buried word line 112 and includes a main portion 126a, an extension portion 126b, and a horizontal portion 126c. The main portion 126a is located on the top surface of the buried word line 112, the extension portion 126b extends upward from periphery of the main portion 126a, and the horizontal portion 126c is connected to a top portion of the extension portion 126b to form the second barrier layer 126 having a "U"-shaped cross section.

The cross-sectional shape of the second barrier layer 126 may be changed by controlling a thickness of the barrier material layer 120 formed. The thickness of the barrier material layer 120 is less than a width of the dielectric structure 118, therefore the second barrier layer 126 formed may have the horizontal portion 126c. When the thickness of the barrier material layer 120 is equal to the width of the dielectric structure 118, the second barrier layer 126 formed does not have the horizontal portion 126c. In addition, the thickness of the barrier material layer 120 cannot be greater than the width of the dielectric structure 118, otherwise, the second barrier layer having the extension portion cannot be formed.

Figure 1G:
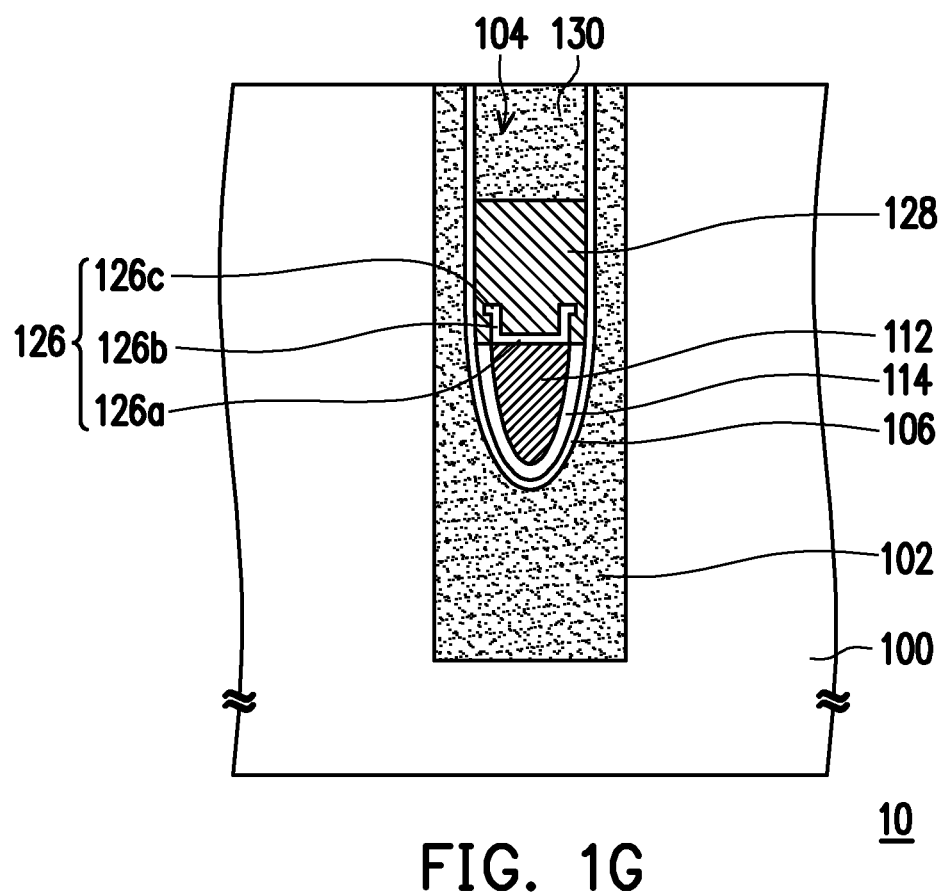

With reference to FIG. 1G an etching process is performed to remove the dielectric structure 108 and the protective layer 124. Then, a channel layer 128 is formed on the first barrier layer 114 and the second barrier layer 126. A method of forming the channel layer 128 is, for example, to first form a channel material layer on the substrate 100 to fill up the trench 104, and then perform an etch-back process to remove the channel material layer on the surface of the substrate 100 and the upper portion of the trench 104. In particular, an electric field generated by the channel layer 128 must be lower than the electric field generated by the buried word line 112 during operation of the device, which is further described later. Therefore, when the buried word line 112 is a tungsten layer, the channel layer 128 is a polysilicon layer, but the disclosure is not limited thereto. The second barrier layer 126 is not exposed after the above-mentioned etch-back process is performed. That is, the channel layer 128 completely wraps the second barrier layer 126 and is in contact with the first barrier layer 114 at periphery of the second barrier layer 126. In other embodiments, the channel layer 128 may expose a portion of the second barrier layer 126 after the above-mentioned etch-back process is performed, and the channel layer 128 is still in contact with the first barrier layer 114 at the periphery of the second barrier layer 126. For example, the horizontal portion 126c and a portion of the extension portion 126b of the second barrier layer 126 may be exposed. Subsequently, a second isolation structure 130 is formed on the channel layer 128 to complete formation of the buried word line structure 10, a material of the second isolation structure 130 is for example, silicon nitride, so as to prevent damage during processing of the oxide layer on the substrate 100 in a subsequent manufacturing process.

The buried word line structure of the disclosure is described by taking FIG. 1G as an example in the following paragraph.

With reference to FIG. 1G in a buried word line structure 10, the second barrier layer 126 having the extension portion 126b is disposed on the buried word line 112, and the channel layer 128 is disposed on the second barrier layer 126 and extends downward next to the extension portion 126b to connect to the first barrier layer 114. In this way, the electric field in the corner region adjacent to the buried word line 112 can be effectively reduced during the operation of the device, so as to prevent the electrons stored in the capacitor subsequently formed on the substrate 100 from being attracted by the electric field generated by the buried word line 112. This can reduce or prevent generation of the leakage current.

Although the disclosure has been disclosed with the foregoing exemplary embodiments, they are not intended to limit the disclosure. Any person skilled in the art can make various changes and modifications within the spirit and scope of the disclosure. Accordingly, the scope of the disclosure is defined by the claims appended hereto and their equivalents.

What is claimed is:

1. A buried word line structure, comprising:
   a first isolation structure, disposed in the substrate and has a trench;
   a buried word line, disposed on a bottom surface of the trench;
   a first barrier layer, disposed between the buried word line and a sidewall and the bottom surface of the trench;
   a second barrier layer, covering a top surface of the buried word line, and comprising a main portion and an extension portion, wherein the main portion is located on the buried word line, and the extension portion extends upward from periphery of the main portion;
   a channel layer, disposed on the first barrier layer and the second barrier layer; and
   a second isolation structure, disposed on the channel layer.

2. The buried word line structure according to claim 1, wherein the channel layer wraps the second barrier layer and is in contact with the first barrier layer.

3. The buried word line structure according to claim 1, wherein the second barrier layer further comprises a horizontal portion connected to a top portion of the extension portion.

4. The buried word line structure according to claim 1, further comprising:
   an insulation layer, disposed on the sidewall and the bottom surface of the trench, and in contact with the sidewall and the bottom surface of the trench.

5. The buried word line structure according to claim 1, wherein the buried word line comprises a tungsten layer.

6. The buried word line structure according to claim 1, wherein the channel layer comprises a polysilicon layer.

7. A manufacturing method of a buried word line structure, comprising:
   forming a first isolation structure in a substrate;
   forming a trench in the first isolation structure;
   forming a first barrier layer on a lower portion sidewall and a bottom surface of the trench;
   forming a buried word line on the first barrier layer;
   forming a second barrier layer on a top surface of the buried word line, wherein the second barrier layer comprises a main portion and an extension portion, the main portion is located on the buried word line, and the extension portion extends upward from periphery of the main portion;
   forming a channel layer on the first barrier layer and the second barrier layer; and
   forming a second isolation structure on the channel layer.

8. The manufacturing method of the buried word line structure according to claim 7, wherein formation of the second barrier layer comprises:
   forming a dielectric layer on a surface of the substrate, on a sidewall of the trench, on the first barrier layer, and on the buried word line after the buried word line is formed, wherein a thickness of the dielectric layer does not exceed a thickness of the first barrier layer;
   removing a portion of the dielectric layer to form a dielectric structure on the first barrier layer and expose the top surface of the buried word line;
   forming a barrier material layer on the surface of the substrate, the sidewall of the trench, the dielectric structure, and the top surface of the buried word line;
   forming a protective layer on the barrier material layer, wherein the protective layer exposes the barrier material layer on an upper portion of the trench;
   performing an anisotropic etching process to remove a portion of the barrier material layer by using the protective layer as a mask; and
   removing the protective layer and the dielectric structure.

9. The manufacturing method of the buried word line structure according to claim 7, wherein the channel layer wraps the second barrier layer and is in contact with the first barrier layer.

10. The manufacturing method of the buried word line structure according to claim 7, further comprising:
    forming an insulation layer on a sidewall and the bottom surface of the trench prior to formation of the first barrier layer.

* * * * *